(12) United States Patent
Yeh et al.

(10) Patent No.: US 12,389,583 B2
(45) Date of Patent: Aug. 12, 2025

(54) LAYOUT PATTERN FOR STATIC RANDOM ACCESS MEMORY

(71) Applicant: UNITED MICROELECTRONICS CORP., Hsin-Chu (TW)

(72) Inventors: Shu-Wei Yeh, Tainan (TW); Han-Tsun Wang, Tainan (TW); Chang-Hung Chen, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 146 days.

(21) Appl. No.: 18/518,476

(22) Filed: Nov. 23, 2023

(65) Prior Publication Data

US 2025/0142801 A1    May 1, 2025

(30) Foreign Application Priority Data

Oct. 25, 2023  (TW) .................. 112140802

(51) Int. Cl.
  *G11C 11/00*  (2006.01)
  *G11C 11/412*  (2006.01)
  *H10B 10/00*  (2023.01)
(52) U.S. Cl.
  CPC ............ *H10B 10/12* (2023.02); *G11C 11/412* (2013.01)

(58) Field of Classification Search
  CPC ... G11C 11/412; G11C 11/413; G11C 11/419; H01L 27/22; H01L 27/1104
  USPC ........................................................ 365/154
  See application file for complete search history.

(56) References Cited

U.S. PATENT DOCUMENTS

| | | |
|---|---|---|
| 8,009,463 B2 | 8/2011 | Liaw |
| 8,675,397 B2 | 3/2014 | Liaw |
| 8,942,030 B2 | 1/2015 | Liaw |
| 9,275,710 B2 * | 3/2016 | Chan ................. G11C 8/16 |
| 9,342,650 B2 | 5/2016 | Liaw |
| 10,607,981 B2 * | 3/2020 | Yeh ................. H10D 89/10 |
| 2023/0063032 A1 | 3/2023 | Liaw |

* cited by examiner

*Primary Examiner* — Son T Dinh
(74) *Attorney, Agent, or Firm* — Winston Hsu (57) ABSTRACT

The invention provides a layout pattern cell of a static random access memory (SRAM), which at least comprises a first SRAM cell, a plurality of gate structures spanning a plurality of fin structures, so as to form a first pull-up transistor, a second pull-up transistor, a first pull-down transistor, a second pull-down transistor, a first access transistor, a second access transistor, a third access transistor, a fourth access transistor, a first parasitic transistor and a second parasitic transistor located on a substrate, the first parasitic transistor and the first pull-down transistor span the same fin structure, and the fin structure spanned by the first parasitic transistor and the first pull-down transistor is a continuous structure.

20 Claims, 4 Drawing Sheets

LAYOUT PATTERN FOR STATIC RANDOM ACCESS MEMORY

BACKGROUND OF THE INVENTION

1. Field of the Invention

The invention relates to a static random access memory (SRAM), in particular to a layout pattern for reducing the turn-on current (Ion) of a pull-down transistor (PD) and improving the performance of the SRAM.

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

SUMMARY OF THE INVENTION

The invention provides a layout pattern unit of a static random access memory (SRAM), the layout pattern at least includes a first region comprises a first SRAM cell, which includes a plurality of fin structures located on a substrate, a plurality of gate structures located on the substrate, wherein the gate structures span the plurality of fin structures to form a PU1 (first pull-up transistor), a PU2 (second pull-up transistor), a PD1 (first pull-down transistor), a PD2 (second pull-down transistor), a PG1A (first access transistor), a PG1B (second access transistor), a PG2A (third access transistor), a PG2B (fourth access transistor), a first parasitic transistor and a second parasitic transistor located on the substrate, the first parasitic transistor and the PD1 span the same fin structure, and the fin structure spanned by the first parasitic transistor and the PD1 is a continuous structure.

The feature of the present invention is to provide an improved layout pattern of static random access memory (SRAM), which is different from the conventional SRAM pattern in that the fin structure included in the pull-down transistor is a continuous and uninterrupted structure between different regions, so it can be matched with the gate structure to form a parasitic transistor. The applicant found that the formation of parasitic transistors helps to reduce the turn-on current of the pull-down transistor, so that the gap between the turn-on current of the pull-down transistor and the turn-on current of the pull-up transistor is narrowed, and the operation speed of SRAM is improved. In addition, the formation of parasitic transistors can also reduce the probability of leakage current and improve the quality of devices.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
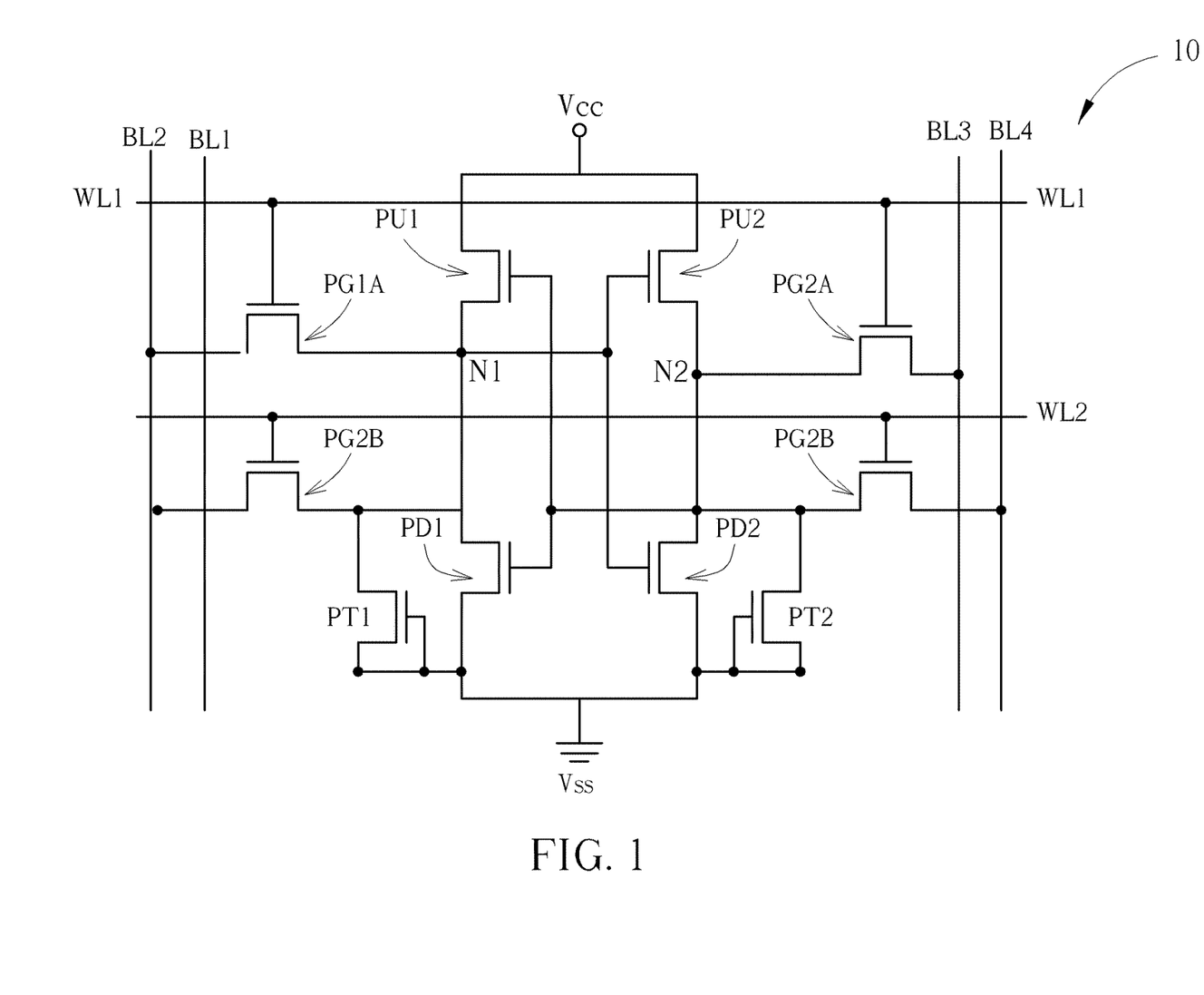
FIG. 1 is a circuit diagram of a set of eight-transistor dual-port static random access memory (8TDP-SRAM) memory cells in the static random access memory of the present invention.
Figure 2:
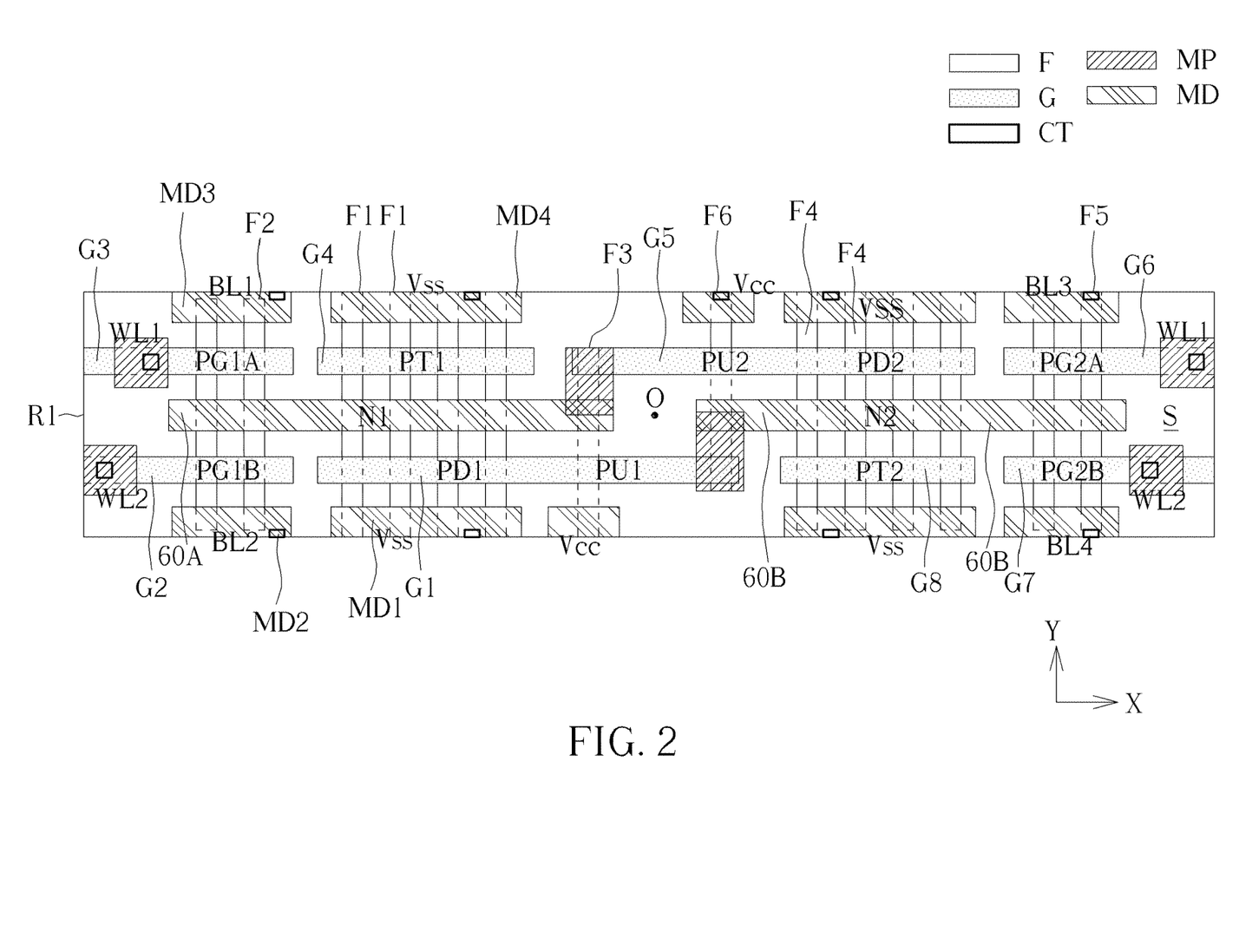
FIG. 2 is a layout diagram of a SRAM according to the first preferred embodiment of the present invention.

Referring to FIGS. 1-2, FIG. 1 illustrates a circuit diagram of an eight-transistor SRAM (8T-SRAM) cell according to a first preferred embodiment of the present invention, and FIG. 2 illustrates a layout diagram of an 8T-SRAM according to the first preferred embodiment of the present invention.

As shown in FIGS. 1-2, the SRAM device of the present invention preferably includes at least one SRAM cell, each SRAM cell including an eight-transistor dual port SRAM (8TDP-SRAM) cell 10.

In this embodiment, each 8TDP-SRAM cell 10 is composed of a first pull-up transistor PU1, a second pull-up transistor PU2, and a first pull-down transistor PD1, a second pull-down transistor PD2, a first pass gate transistor PG1A, a second pass gate transistor PG1B, a third pass gate transistor PG2A and a fourth pass gate transistor PG2B. These eight transistors constitute a set of flip-flops. The first and the second pull-up transistors PU1 and PU2, and the first and the second pull-down transistors PD1 and PD2 constitute a latch circuit that stores data in the storage nodes N1 and N2. Since the first and the second pull-up transistors PU1 and PU2 act as power load devices, they can be replaced by resistors. Under this circumstance, the static random access memory becomes a four-transistor SRAM (4T-SRAM). In this embodiment, the first and the second pull-up transistors PU1 and PU2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PU1 and PU2 of the 8TDP-SRAM cell 10 are composed of p-type metal oxide semiconductor (PMOS) transistors; the first and the second pull-down transistors PD1 and PD2, the first pass gate transistors PG1A, the second pass gate transistors PG1B, the third pass gate transistors PG2A and the fourth pass gate transistors PG2B composed of n-type metal oxide semiconductor (NMOS) transistors, but not limited thereto. The first pull-up transistor PU1 and the first pull-down transistor PD1 constitute an inverter, which further form a series circuit. One end of the series circuit is connected to a voltage source Vcc and the other end of the series circuit is connected to a voltage source Vss. Similarly, the second pull-up transistor PU2 and the second pull-down transistor PD2 constitute another inverter and a series circuit. One end of the series circuit is connected to the voltage source Vcc and the other end of the series circuit is connected to the voltage source Vss. Each pass gate transistors (including the first pass gate transistor PG1A, the second pass gate transistor PG1B, the third pass gate transistor PG2A and the fourth pass gate transistor PG2B) configured with the two cross-coupled inverters respectively, wherein each of the at least one pull-up transistor (PLs), the at least one pull-down transistors (PDs), and the at least two pass gate transistor (PGs) includes a fin field-effect transistor (FinFET).

The storage node N1 is connected to the respective gates of the second pull-down transistor PD2 and the second pull-up transistor PU2. The storage node N1 is also connected to the drain of the first pull-down transistor PD1, the drain of the first pull-up transistor PU1, the drain of the first pass gate transistor PG1A and the drain of the second pass gate transistor PG1B. Similarly, the storage node N2 is connected to the respective gates of the first pull-down transistor PD1 and first the pull-up transistor PU1. The storage node N2 is also connected to the drain of the second pull-down transistor PD2, the drain of the second pull-up transistor PU2, the drain of the third pass gate transistor PG2A and the drain of the fourth pass gate transistor PG2B. The gates of the first pass gate transistor PG1A and the third pass gate transistor PG1B are respectively coupled to a first word line (WL1); the gates of the second pass gate transistor PG1B and the fourth pass gate transistor PG2B are respectively coupled to a second word line (WL2); the source of the first pass gate transistor PG1A is coupled to a first bit line (BL1); the source of the second pass gate transistor PG1B is coupled to a second bit line (BL2); the source of the third pass gate transistor PG2A is coupled to a third bit line (BL3); and the source of the fourth pass gate transistor PG2B is coupled to a fourth bit line (BL4).

In addition, this embodiment further includes a first parasitic transistor PT1 and a second parasitic transistor PT2. The gate of and the source of the first parasitic transistor PT1 is connected to each other, and further connect to the voltage source Vss, and the drain of the first parasitic transistor PT1 is connected to the storage node N1. As for the gate and source of the second parasitic transistor PT2 are connected to each other too, and connect to the voltage source Vss, and the drain of the second parasitic transistor PT2 is connected to the storage node N2. In this embodiment, the first parasitic transistor PT1 and the second parasitic transistor PT2 are only nonfunctional transistors generated due to the arrangement of layout patterns in the manufacturing process, and their gates are connected to their sources and kept off, so they have no transistor effect. However, the formation of parasitic transistors can partially affect the electrical properties of the first pull-down transistor PD1 and the second pull-down transistor PD2, which will be described in the following paragraphs.

Please refer to FIG. 2. In this embodiment, an 8TDP-SRAM memory cell 10 is located in a first region R1, and is disposed on a substrate S, such as a silicon substrate or a silicon-on-insulator (SOI) substrate. A plurality of fin structures F arranged in parallel are disposed on the substrate S, and shallow trench isolation (not shown) is provided around each fin structure F.

In addition, the substrate S includes a plurality of gate structures G. Each transistor (including the first pull-up transistor PU1, the first pull-down transistor PD1, the second pull-up transistor PU2, the second pull-down transistor PD2, the first access transistor PG1A, the second access transistor PG1B, the third access transistor PG2A, the fourth access transistor PG2B, the first parasitic transistor PT1 and the second parasitic transistor PT2) includes a gate structure G that spans at least one fin structure F to form each transistor.

As shown in FIG. 2, in order to clearly define the position of each gate structure G, the gate structures G are defined as a first gate structure G1, a second gate structure G2, a third gate structure G3, a fourth gate structure G4, a fifth gate structure G5, a sixth gate structure G6, a seventh gate structure G7 and an eighth gate structure G8. At the same time, the fin structures F are defined as fin structures F1, F2, F3, F4, F5 and F6 respectively according to their positions. It can be understood that the first gate structure G1 to the eighth gate structure G8 all belong to the gate structure G, and the fin structure F1 to the fin structure F6 also belong to the fin structure F. The first gate structure G1 spans the fin structure F1 to form a first pull-down transistor PD1, the first gate structure G1 spans the fin structure F3 to form a first pull-up transistor PU1, the second gate structure G2 spans the fin structure F2 to form a second access transistor PG1B, the third gate structure G3 spans the fin structure F2 to form the first access transistor PG1A, the fourth gate structure G4 spans the fin structure F1 to form the first parasitic transistor PT1. On the other hand, the fifth gate structure G5 spans the fin structure F4 to form a second pull-down transistor PD2, the fifth gate structure G5 spans the fin structure F6 to form a second pull-up transistor PU2, the sixth gate structure G6 spans the fin structure F5 to form a third access transistor PG2A, the seventh gate structure G7 spans the fin structure F5 to form a fourth access transistor PG2B, and the eighth gate structure G8 spans the fin structure F4 to form the second parasitic transistor PT2.

It is worth noting that in the first region R1, the patterns of the transistors are mirror symmetrical along the center point O, so the features of the partially symmetrical elements in the following paragraphs will be the same as those of the other half, and will not be repeated here.

In the present invention, each gate structure G is arranged along a first direction (for example, X axis), and each fin structure F is arranged along a second direction (for example, Y axis). Preferably, the first direction and the second direction are perpendicular to each other.

The present invention also includes a first interconnection layer 60A and a second interconnection layer 60B, both of which are arranged along the first direction (X direction). In which the first interconnection layer 60A spans the fin structure f respectively included in the first pull-up transistor PU1, the first pull-down transistor PD1, the first access transistor PG1A and the second access transistor PG1B. The second interconnection layer 60B spans the fin structure f included in the second pull-up transistor PU2, the second pull-down transistor PD2, the third access transistor PG2A and the fourth access transistor PG2B.

In addition, the substrate S includes a plurality of metal layers MP, a metal layer MD and a contact plug CT, which connect different transistors (for example, connecting the gate of the second pull-up transistor PU2 and the drain of the first pull-up transistor PU1) or connecting each transistor to other elements (for example, connecting the source of the first pull-up transistor PU1 to the voltage source Vcc). In this embodiment, the metal layer MP contacts the gate structure G, while the metal layer MD spans the fin structure F but does not contact the gate structure G. The contact plug CT is used to connect the conductive elements of different layers (such as the current metal layer and other metal layers above/below). It can be understood that the metal layer MP, the metal layer MD and the contact plug CT can all be made of materials with good conductivity, such as metals, and may comprise the same or different materials. In addition, the first interconnection layer 60A and the second interconnection layer 60B also belong to the metal layer MD.

For the sake of clarity, in FIG. 2, elements (such as voltage source Vcc, voltage source Vss, first word line WL1, second word line WL2, first bit line BL1, second bit line BL2, third bit line BL3 and fourth bit line BL4) connected to each metal layer MP and MD are directly marked on each metal layer and contact plug CT to clearly express the connection between each metal layer MP and MD and contact plug CT.

In addition, the metal layer MD defined in FIG. 2 is as follows: the metal layer MD1 connects the source of the first pull-down transistor PD1 with the voltage source Vss, the metal layer MD2 connects the source of the second access transistor PG1B and the bit line BL2, the metal layer MD3 connects the source of the first access transistor PG1A and the bit line BL1, the metal layer MD4 connects to the source of the first parasitic transistor PT1. It can be understood that the above metal layers MD1 to MD4 all belong to the metal layer MD.

In this embodiment, the distance between the metal layer MD1 and the metal layer MD2 is equal to the distance between the metal layer MD3 and the metal layer MD4. This configuration can make the overall SRAM pattern distribution more uniform. Moreover, since the distance from the metal layer of each transistor to the adjacent metal layer is equal, the process conditions of each transistor can be controlled in an approximate state, which is beneficial to improving the stability of the structure and process.

Figure 3:
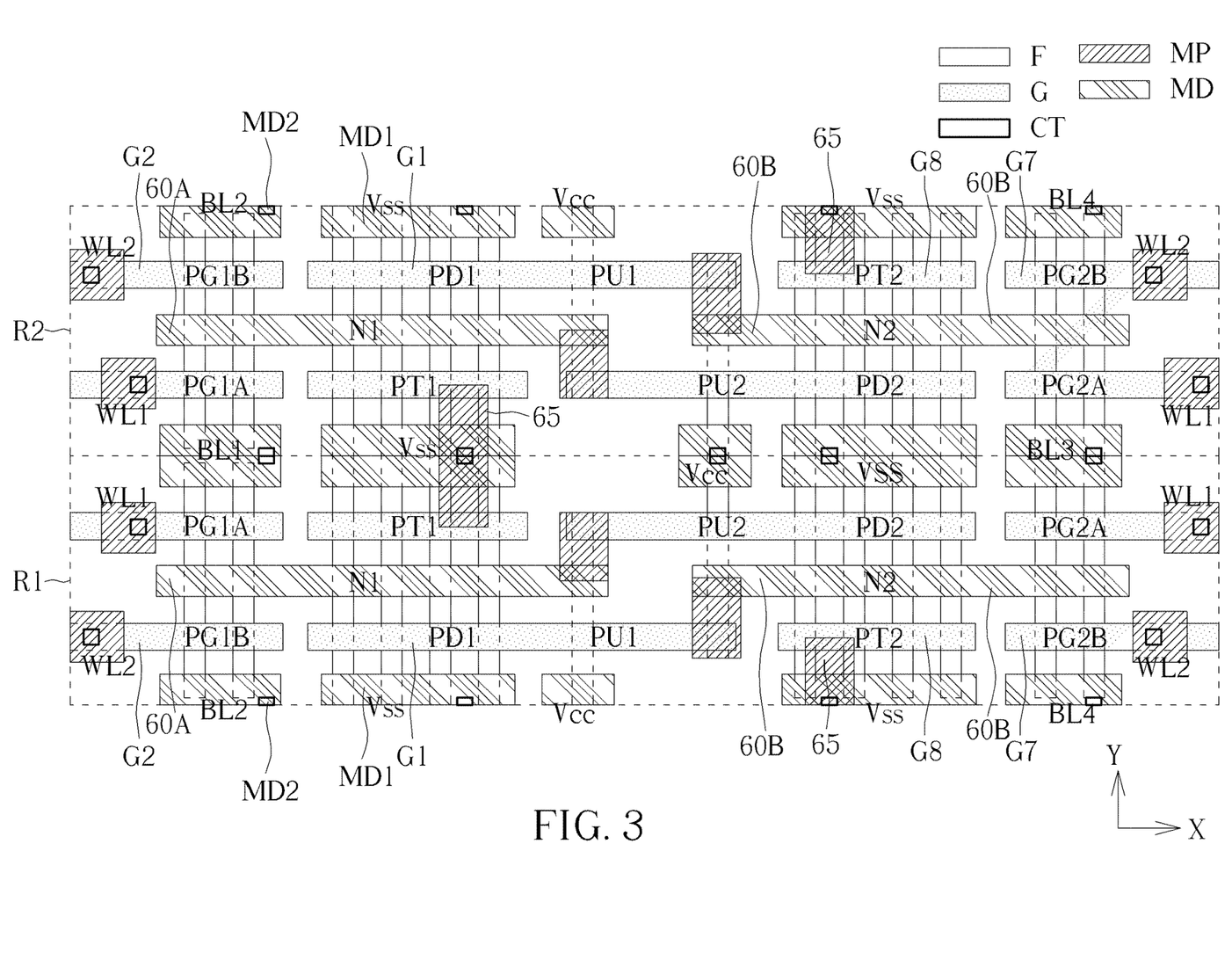
FIG. 3 shows the layout of two adjacent 8TDP-SRAM memory cells 10.

Please refer to FIG. 3, which shows the layout of two adjacent 8TDP-SRAM memory cells 10. In order to clearly describe each element, only one 8TDP-SRAM memory cell is shown in FIG. 2, which is formed in a first region R1, while FIG. 3 focuses on the correlation between two adjacent 8TDP-SRAM memory cells 10, which are located in the adjacent first region R1 and second region R2, so the reference numbers of some elements will be omitted in FIG. 3. However, it is worth noting that in FIG. 2 and FIG. 3, for example, all gate structures, fin structures, metal layers, contact plugs, etc. are drawn with the same pattern. The other elements shown in the present invention are also analogized.

It is also worth noting that the first region R1 and the second region R2 each comprise only one 8TDP-SRAM memory cell 10, and the substrate S may also comprise other regions with 8TDP-SRAM memory cells besides the first region R1 and the second region R2.

As shown in FIG. 3, one of the characteristics of this embodiment is that, compared with the conventional 8TDP-SRAM pattern, the fin structure F1 spanned by the first pull-down transistor PD1 of the present invention extends to other regions in the second direction (Y direction), for example, from the first region R1 to the second region R2, and the fourth gate structure G4 in the first region R1 also spans the fin structure F1 to form the first parasitic transistor PT1. Similarly, due to the symmetry of the pattern, the fin structure F4 also extends to other regions in the second direction (Y direction), for example, from the first region R1 to the second region R2, and the eighth gate structure G8 in the first region R1 also spans the fin structure F4 to form the second parasitic transistor PT2. The following paragraphs only focus on the patterns in the left half of the first region R1, and the patterns in the right half are not repeated because of their similar characteristics.

In addition, in FIG. 3, a metal layer 65 is formed to electrically connect the source and gate of the first parasitic transistor PT1, and to connect the source and gate of the first parasitic transistor PT1 with another adjacent first parasitic transistor PT1 (i.e., the first parasitic transistor PT1 located in the second region R2). And then the metal layer 65 is connected to the voltage source Vss through a contact plug (not shown). Therefore, in the circuit, the first parasitic transistor PT1 (and the second parasitic transistor PT2) represent constant turn-off. The purpose of forming the metal layer 65 is not only to connect the gate and source of the parasitic transistor itself, but also to connect the parasitic transistor to the voltage source Vss through the metal layer 65, so that the parasitic transistor will not easily affect the electrical properties of the pull-down transistor around it, and achieve the effect of stabilizing the current of the pull-down transistor.

The applicant found that in the conventional 8TDP-SRAM pattern, the turn-on current (Ion) of the pull-down transistor PD1/PD2 is relatively large, which will lead to insufficient voltage conversion rate when the node N1 (or the node N2) raises the low voltage to the high voltage, because the Ion of PD is larger than that of PU, which makes it difficult to raise the voltage. Therefore, the switching rate of SRAM is reduced, which affects the quality and execution speed of SRAM.

The applicant found that one of the methods to reduce the above problems is to reduce the difference between the Ion of PD and the Ion of PU, and one of the methods is to lengthen the fin structure (such as fin structure F1 or F4) included in the PD and form the parasitic transistors. The existence of parasitic transistors can slightly reduce the Ion of PD, so the problem of insufficient voltage conversion rate can be solved. In addition, the applicant found that forming transistors also helps to reduce the leakage current of SRAM patterns.

Figure 4:
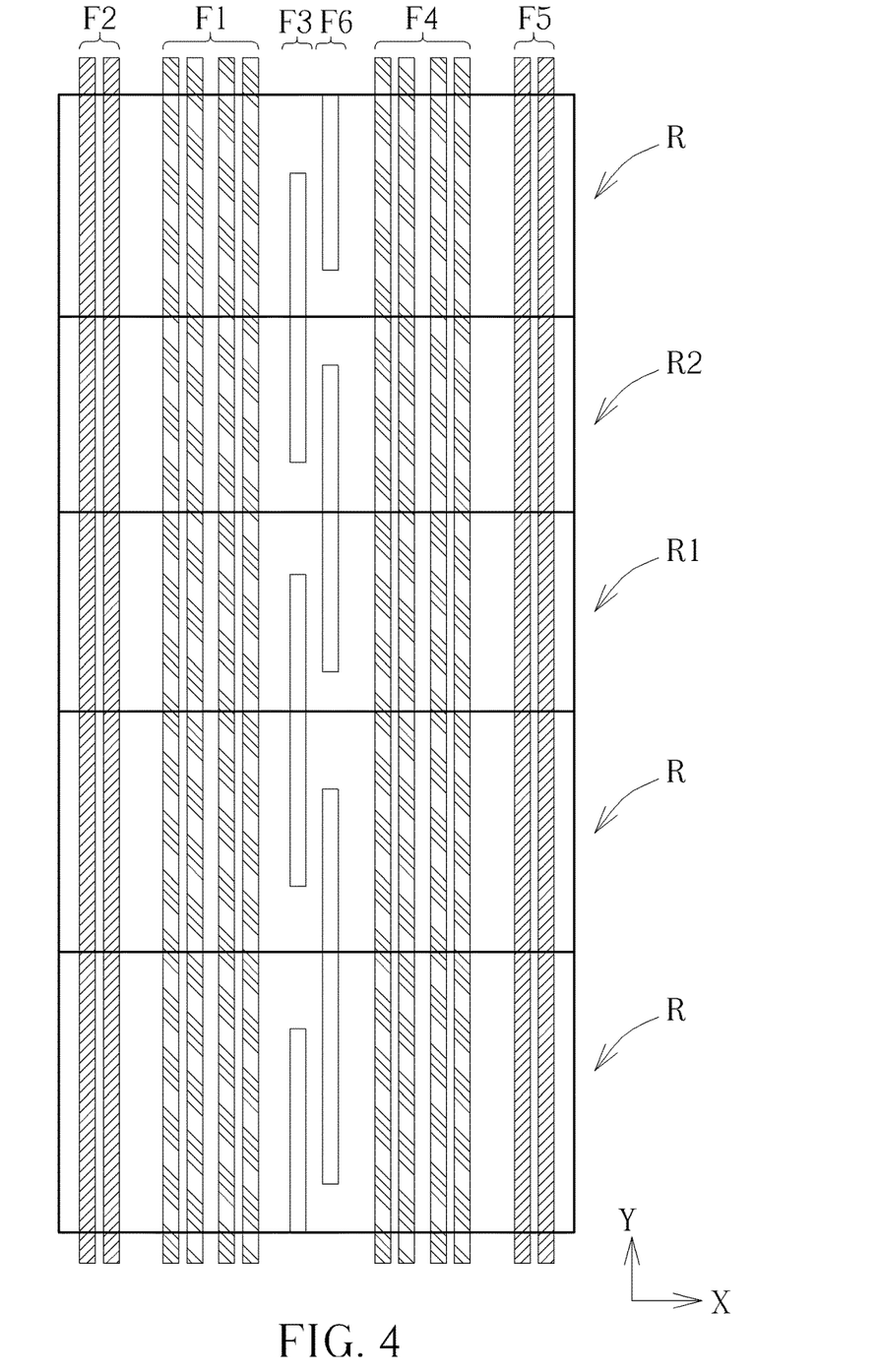
FIG. 4 is a schematic diagram showing the distribution of a plurality of regions and fin structures in the present invention.

FIG. 4 is a schematic diagram showing the distribution of a plurality of regions and fin structures in the present invention. It is worth noting that the 8TDP-SRAM memory cell 10 of the present invention can be repeatedly arranged on the substrate S. As shown in FIG. 4, the substrate S includes a first region R1, a second region R2 and a plurality of regions R. Each region R includes an 8TDP-SRAM memory cell which is the same as the first region R1 or the second region R2. FIG. 4 focuses on describing the relationship between regions and fin structures, so only fin structures F1 to F6 are drawn, and other elements are omitted. It can be seen from FIG. 4 that the fin structure (F1 or F4) included in the pull-down transistors (PD1 or PD2) and the parasitic transistors (PT1 or PT2) will extend into different regions (including the first region R1, the second region R2 and the plurality of regions R) along the second direction (Y-axis). That is to say, the fin structure F1 and the fin structure F4 are continuous and will not be truncated or be cut off. In addition, in different regions, the fin structure F2 and the fin structure F5 included in the access transistor are also continuous and will not be truncated or be cut off. Similarly, the active regions (not shown) in the substrate S under the fin structures F1, F2, F4 and F5 are also continuous structures in different regions without being cut off.

Compared with the prior art, in order to isolate devices in different regions, which are located in adjacent regions, fin structures between parasitic transistors are usually separated or be cut off (for example, by photolithography). In this embodiment, in adjacent regions, the fin structures between the parasitic transistors are in direct contact without being cut, and then connected to the voltage source Vss (which means constant off in the circuit), so as to achieve the effects of reducing the leakage current and improving the SRAM operation rate.

More specifically, according to the applicant's experimental results, the fin structure of the pull-down transistors (PD1 or PD2) can be made into a continuous extension structure (not cut off in different regions), which can increase the operating voltage of the pull-down transistors and slightly reduce the turn-on current of the pull-down transistors (about 5% reduction). In this way, the gap between the turn-on current of the pull-down transistors and the turn-on current of the pull-up transistors can be narrowed, and the writing rate of SRAM can be improved.

Based on the above description and drawings, the present invention provides a layout pattern unit of a static random access memory (SRAM), which at least includes a first SRAM cell 10 in a first region R1, the first SRAM cell 10 includes a plurality of fin structures F on a substrate S and a plurality of gate structures G on the substrate S, the plurality of gate structures G span the plurality of fin structures F, so as to form a first pull-up transistor (PU1), a second pull-up transistor (PU2), a first pull-down transistor (PD1), a second pull-down transistor (PD2), a first access transistor (PG1A), a second access transistor (PG1B), a third access transistor (PG2A), a fourth access transistor (PG2B), a first parasitic transistor PT1 and a second parasitic transistor PT2 located on the substrate S, the first parasitic transistor PT1 and the first pull-down transistor PD1 span the same fin structure F1, and the fin structure F1 spanned by the first parasitic transistor PT1 and the first pull-down transistor PD1 is a continuous structure.

In some embodiments of the present invention, a source and a gate of the first parasitic transistor PT1 are connected to each other, and further connected to a source of the first pull-down transistor PD1 (as shown in FIG. 1).

In some embodiments of the present invention, the source and gate of the first parasitic transistor PT1 and the source of the first pull-down transistor PD1 are further connected to a Vss voltage source (as shown in FIG. 1).

In some embodiments of the present invention, the gate structures include a first gate structure G1, a second gate structure G2, a third gate structure G3 and a fourth gate structure G4, the first pull-down transistor PD1 includes the first gate structure G1, the second access transistor PG1B includes the second gate structure G2, the first access transistor PG1A includes the third gate structure G3 and the first parasitic transistor PT1 includes the fourth gate structure G4.

In some embodiments of the present invention, it further includes a first metal layer MD1 electrically connected to a source of the first pull-down transistor PD1, a second metal layer MD2 electrically connected to a source of the second access transistor PG1B, a third metal layer MD3 electrically connected to a source of the first access transistor PG1A, and a fourth metal layer MD4 electrically connected to a source of the first parasitic transistor PT1.

In some embodiments of the present invention, the distance between the first metal layer MD1 and the second metal layer MD2 in a horizontal direction (X direction) is equal to the distance between the third metal layer MD3 and the fourth metal layer MD4 in the horizontal direction.

In some embodiments of the present invention, the distance from the second metal layer MD2 to the fin structure F1 spanned by the first parasitic transistor PT1 and the first pull-down transistor PD1 in the horizontal direction is equal to the distance from the third metal layer MD3 to the fin structure F1 spanned by the first parasitic transistor PT1 and the first pull-down transistor PD1 in the horizontal direction.

In some embodiments of the present invention, the areas and sizes of the second metal layer MD2 and the third metal layer MD3 are equal.

In some embodiments of the present invention, the first metal layer MD1 and the fourth metal layer MD4 are aligned in a vertical direction (Y direction), and the second metal layer MD2 and the third metal layer MD3 are aligned in the vertical direction.

In some embodiments of the present invention, the first metal layer MD1 is electrically connected to a Vss voltage source, the second metal layer MD2 is electrically connected to a bit line BL2, the third metal layer MD3 is electrically connected to another bit line BL1, and the fourth metal layer MD4 is electrically connected to the Vss voltage source.

In some embodiments of the present invention, a fifth metal layer 65 is further included. The fifth metal layer 65 is connected with and directly contacts the fourth metal layer MD4 and the fourth gate structure G4, and is arranged along a vertical direction (Y direction).

In some embodiments of the present invention, a second region R2 is further included adjacent to the first region R1, and another SRAM cell is included in the second region, wherein the SRAM cell in the second region R2 and the SRAM cell included in the first region R1 are arranged in mirror images.

In some embodiments of the present invention, the fifth metal layer 65 is further connected to a parasitic transistor in the second region R2 (that is, the first parasitic transistor located in the second region R2).

In some embodiments of the present invention, the fin structure F1 spanned by the first parasitic transistor PT1 and the first pull-down transistor PD1 extends into the second region R2 and is a continuous structure.

In some embodiments of the present invention, the first pull-up transistor PU1 spans the fin structure F3, and the fin structure F3 spanned by the first pull-up transistor PU1 does not extend into the second region R2 (as shown in FIG. 3, the fin structure F3 is cut off when it reaches the boundary of the second region R2).

In some embodiments of the present invention, the substrate S further includes a plurality of regions R, and each of the plurality of regions includes an SRAM cell, wherein the first region R1, the second region R2 and the plurality of regions R are arranged in the same direction, and the fin structure F1 spanned by the first parasitic transistor PT1 and the first pull-down transistor PD1 extends into the first region R1, the second region R2 and the plurality of regions R without being cut off.

In some embodiments of the present invention, an active region is located under the fin structure F1 spanned by the first parasitic transistor PT1 and the first pull-down transistor PD1, and the active region extends into the first region R1, the second region R2 and a plurality of regions R without being cut off.

In some embodiments of the present invention, the first pull-up transistor PU1, the first pull-down transistor PD1 and the second access transistor PG1B are aligned along a horizontal direction (X direction) when viewed from a top view, and the first access transistor PG1A and the first parasitic transistor PT1 are aligned along the horizontal direction.

In some embodiments of the present invention, when viewed from a top view, the first pull-down transistor PD1 and the first parasitic transistor PT1 are aligned along a vertical direction (Y direction), and the vertical direction and the horizontal direction are perpendicular to each other.

In some embodiments of the present invention, the numbers of the fin structures spanned by the first parasitic transistor PT1 and spanned by the first pull-down transistor PD1 are equal (in the example of FIG. 2, there are four fin structures spanned by the first parasitic transistor PT1 and spanned by the first pull-down transistor PD1, but the present invention is not limited to this).

The feature of the present invention is to provide an improved layout pattern of static random access memory (SRAM), which is different from the conventional SRAM pattern in that the fin structure included in the pull-down transistor is a continuous and uninterrupted structure between different regions, so it can be matched with the gate structure to form a parasitic transistor. The applicant found that the formation of parasitic transistors helps to reduce the turn-on current of the pull-down transistor, so that the gap between the turn-on current of the pull-down transistor and the turn-on current of the pull-up transistor is narrowed, and the operation speed of SRAM is improved. In addition, the formation of parasitic transistors can also reduce the probability of leakage current and improve the quality of devices.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A layout pattern unit of a static random access memory (SRAM), at least comprising:
a first region comprises a first SRAM cell, which includes:
a plurality of fin structures located on a substrate;
a plurality of gate structures located on the substrate, wherein the gate structures span the plurality of fin structures to form a PU1 (first pull-up transistor), a PU2 (second pull-up transistor), a PD1 (first pull-down transistor), a PD2 (second pull-down transistor), a PG1A (first access transistor), a PG1B (second access transistor), a PG2A (third access transistor), a PG2B (fourth access transistor), a first parasitic transistor and a second parasitic transistor located on the substrate;
wherein the first parasitic transistor and the PD1 span the same fin structure, and the fin structure spanned by the first parasitic transistor and the PD1 is a continuous structure.

2. The layout pattern unit of the SRAM according to claim 1, wherein a source and a gate of the first parasitic transistor are connected to each other, and further connected to a source of the PD1.

3. The layout pattern unit of the SRAM according to claim 2, wherein the source and the gate of the first parasitic transistor and the source of the PD1 are further connected to a Vss voltage source.

4. The layout pattern unit of SRAM according to claim 1, wherein the gate structures comprise a first gate structure, a second gate structure, a third gate structure and a fourth gate structure, wherein the PD1 comprises the first gate structure, the PG1B comprises the second gate structure, the PG1A comprises the third gate structure and the first parasitic transistor comprises the fourth gate structure.

5. The layout pattern unit of the SRAM according to claim 4, further comprising:
a first metal layer electrically connected to a source of the PD1;
a second metal layer electrically connected to a source of the PG1B;
a third metal layer electrically connected to a source of the PG1A; and
a fourth metal layer electrically connected to a source of the first parasitic transistor.

6. The layout pattern unit of SRAM according to claim 5, wherein the distance between the first metal layer and the second metal layer in a horizontal direction is equal to the distance between the third metal layer and the fourth metal layer in the horizontal direction.

7. The layout pattern unit of SRAM according to claim 5, wherein the distance from the second metal layer to the fin structure spanned by the first parasitic transistor and the PD1 in a horizontal direction is equal to the distance from the third metal layer to the fin structure spanned by the first parasitic transistor and the PD1 in the horizontal direction.

8. The layout pattern unit of SRAM according to claim 5, wherein the second metal layer and the third metal layer are equal in area and size.

9. The layout pattern unit of SRAM according to claim 6, wherein the first metal layer and the fourth metal layer are aligned in a vertical direction, and the second metal layer and the third metal layer are aligned in the vertical direction.

10. The layout pattern unit of SRAM according to claim 5, wherein the first metal layer is electrically connected to a Vss voltage source, the second metal layer is electrically connected to a bit line, the third metal layer is electrically connected to another bit line, and the fourth metal layer is electrically connected to the Vss voltage source.

11. The layout pattern unit of the SRAM according to claim 5, further comprising a fifth metal layer, which is connected and directly contacted with the fourth metal layer and the fourth gate structure and arranged along a vertical direction.

12. The layout pattern unit of the SRAM according to claim 11, further comprising a second region adjacent to the first region, and another SRAM cell is comprised in the second region, wherein the SRAM cell in the second region and the SRAM cell comprised in the first region are arranged in mirror images.

13. The layout pattern unit of the SRAM according to claim 12, wherein the fifth metal layer is further connected to a parasitic transistor in the second region.

14. The layout pattern unit of the SRAM according to claim 12, wherein the fin structure spanned by the first parasitic transistor and the PD1 extends into the second region and is a continuous structure.

15. The layout pattern unit of the SRAM according to claim 12, wherein the PU1 spans one of the fin structures, and the fin structure spanned by the PU1 does not extend to the second region.

16. The layout pattern unit of the SRAM according to claim 12, wherein the substrate further comprises a plurality of regions, and each of the plurality of regions comprises an SRAM cell, wherein the first region, the second region and the plurality of regions are arranged in the same direction, and the fin structure spanned by the first parasitic transistor and the PD1 extends into the first region, the second region and the plurality of regions without being cut off.

17. The layout pattern unit of the SRAM according to claim 16, further comprising an active region under the fin structure spanned by the first parasitic transistor and the PD1, and the active region extends into the first region, the second region and the plurality of regions without being cut off.

18. The layout pattern unit of the SRAM according to claim 1, wherein the PU1, the PD1 and the PG1B are aligned along a horizontal direction when viewed from a top view, and the PG1A and the first parasitic transistor are aligned along the horizontal direction.

19. The layout pattern unit of the SRAM according to claim 18, wherein the PD1 and the first parasitic transistor are aligned along a vertical direction when viewed from the top view, and the vertical direction and the horizontal direction are perpendicular to each other.

20. The layout pattern unit of the SRAM according to claim 1, wherein the numbers of the fin structures spanned by the first parasitic transistor and the spanned by the PD1 are equal.

\* \* \* \* \*